US009523379B2

(12) United States Patent
Stothers

(10) Patent No.: US 9,523,379 B2
(45) Date of Patent: Dec. 20, 2016

(54) FASTENERS

(75) Inventor: Peter Stothers, Auckland (NZ)

(73) Assignee: RACK STUDS LIMITED, Auckland (NZ)

( * ) Notice: Subject to any disclaimer, the term of this patent is extended or adjusted under 35 U.S.C. 154(b) by 129 days.

(21) Appl. No.: 14/355,122

(22) PCT Filed: Oct. 31, 2011

(86) PCT No.: PCT/NZ2011/000230
§ 371 (c)(1),
(2), (4) Date: Aug. 27, 2014

(87) PCT Pub. No.: WO2013/066193
PCT Pub. Date: May 10, 2013

(65) Prior Publication Data
US 2014/0366335 A1    Dec. 18, 2014

(51) Int. Cl.
| F16B 5/06 | (2006.01) |
| F16B 5/02 | (2006.01) |
| F16B 33/00 | (2006.01) |
| F16B 35/06 | (2006.01) |
| F16B 43/02 | (2006.01) |
| H05K 7/14 | (2006.01) |

(52) U.S. Cl.
CPC .......... *F16B 5/0621* (2013.01); *F16B 5/0208* (2013.01); *F16B 33/002* (2013.01); *F16B 35/06* (2013.01); *F16B 43/025* (2013.01); *H05K 7/1489* (2013.01); *F16B 5/065* (2013.01); *Y10T 24/34* (2015.01)

(58) Field of Classification Search
CPC ..... F16B 5/0621; F16B 33/002; F16B 43/025; F16B 35/06; F16B 5/065; F16B 5/0208; Y10T 24/34; H05K 7/1489
See application file for complete search history.

(56) References Cited

U.S. PATENT DOCUMENTS

| 4,493,580 A | 1/1985 | Ruehl |
| 4,730,967 A | 3/1988 | Warkentin |
| 4,778,320 A * | 10/1988 | Nakama ................. F16B 5/065 |
| | | 24/297 |
| 6,353,542 B1 | 3/2002 | Smith |
| 6,538,894 B1 | 3/2003 | Treiber et al. |
| 6,594,870 B1 | 7/2003 | Lambrecht et al. |

(Continued)

FOREIGN PATENT DOCUMENTS

| DE | 9405831 | 6/1994 |
| DE | 4309973 A1 | 9/1994 |

(Continued)

*Primary Examiner* — Robert J Sandy
*Assistant Examiner* — Louis Mercado
(74) *Attorney, Agent, or Firm* — Larson & Anderson, LLC

(57) ABSTRACT

A fastener to engage and hold a first member to a second member. The fastener has a clip member adapted to install into a first aperture on the first member, the clip member having, a main body and a clipping tongue biased away from the body to engage the aperture. The clip also has a mounting portion extending outwardly. A washer can pass over the mounting portion and the washer has an extension to pass between and wedge the main body and the clipping tongue apart. A fastener then engages the mounting portion to secure the clip member, washer, and second member, to the first member.

34 Claims, 6 Drawing Sheets

(56) References Cited

U.S. PATENT DOCUMENTS

| | | | |
|---|---|---|---|
| 6,682,282 | B2 | 1/2004 | Allen |
| 6,746,193 | B1 | 6/2004 | Drake |
| 7,731,142 | B2 | 6/2010 | Chen et al. |
| 7,751,197 | B2 | 7/2010 | Hoshino et al. |
| 2001/0046426 | A1* | 11/2001 | Lubera .................. B60N 3/026 411/182 |
| 2004/0049895 | A1* | 3/2004 | Draggoo ............. B60R 13/0206 24/297 |
| 2004/0052575 | A1* | 3/2004 | Draggoo ............. B60R 13/0206 403/298 |
| 2005/0019133 | A1 | 1/2005 | Allen et al. |
| 2005/0034282 | A1* | 2/2005 | Kurily ................. B60R 13/0206 24/297 |
| 2005/0196230 | A1 | 9/2005 | Dubon et al. |
| 2007/0145220 | A1 | 6/2007 | Foster, Sr. et al. |
| 2009/0219702 | A1 | 9/2009 | Mazura et al. |
| 2012/0240362 | A1* | 9/2012 | Lee .................... B60R 13/0206 24/292 |

FOREIGN PATENT DOCUMENTS

| | | |
|---|---|---|
| GB | 1123733 | 8/1968 |
| GB | 2375568 | 12/2004 |
| GB | 2375568 B | 12/2004 |
| JP | 2001298281 | 10/2001 |
| JP | 4757659 | 6/2011 |

* cited by examiner

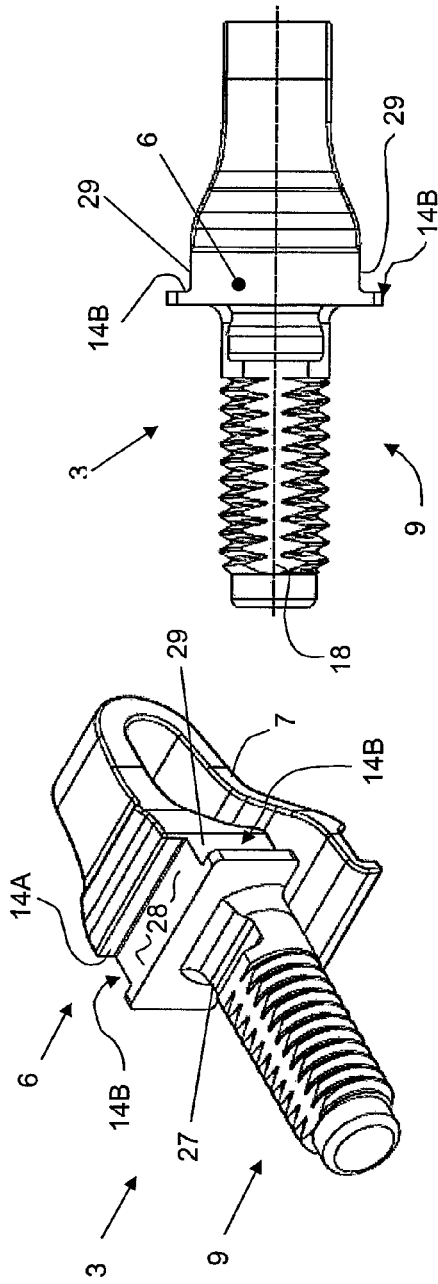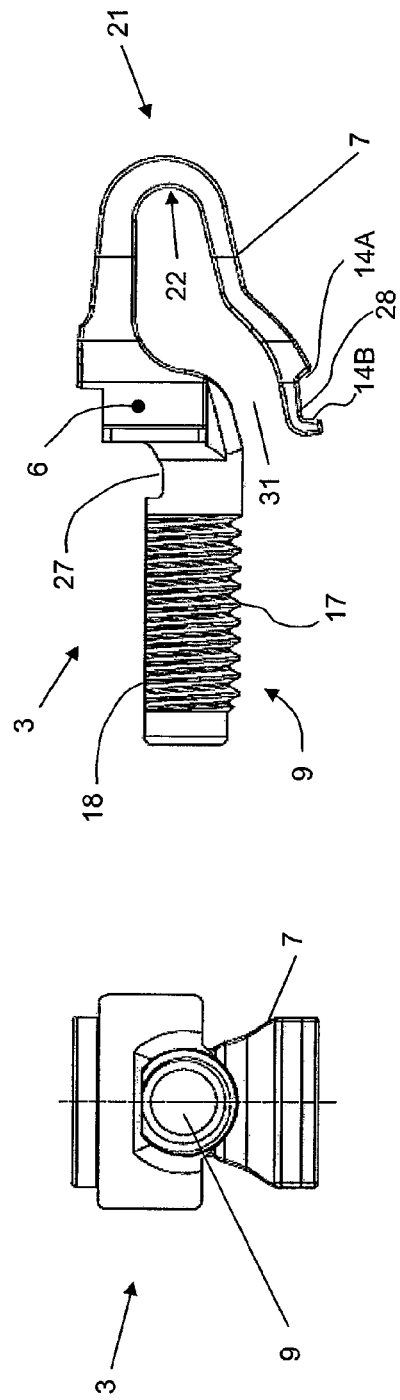

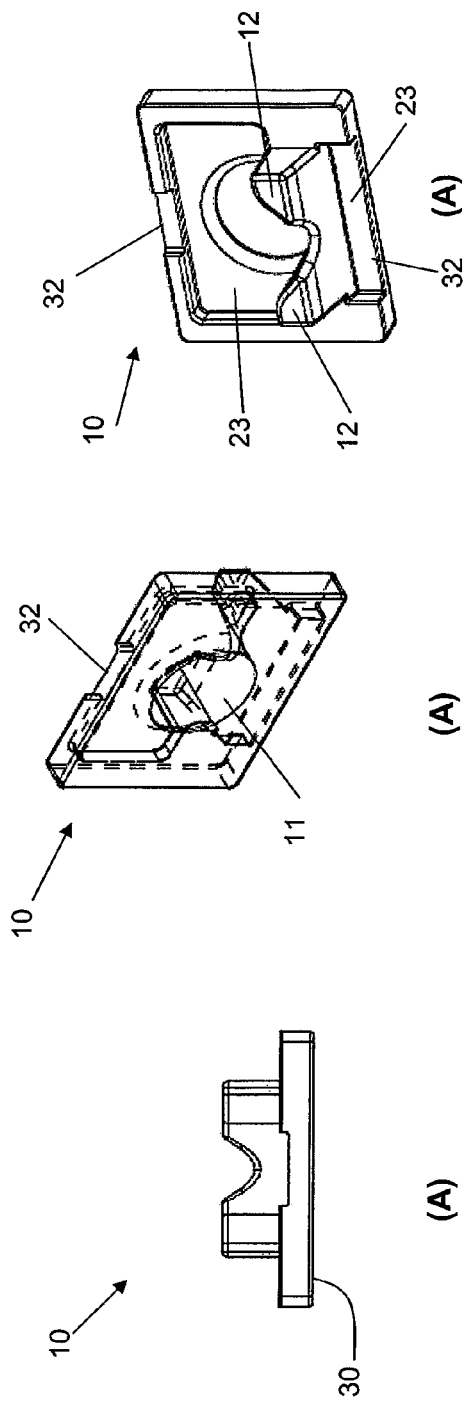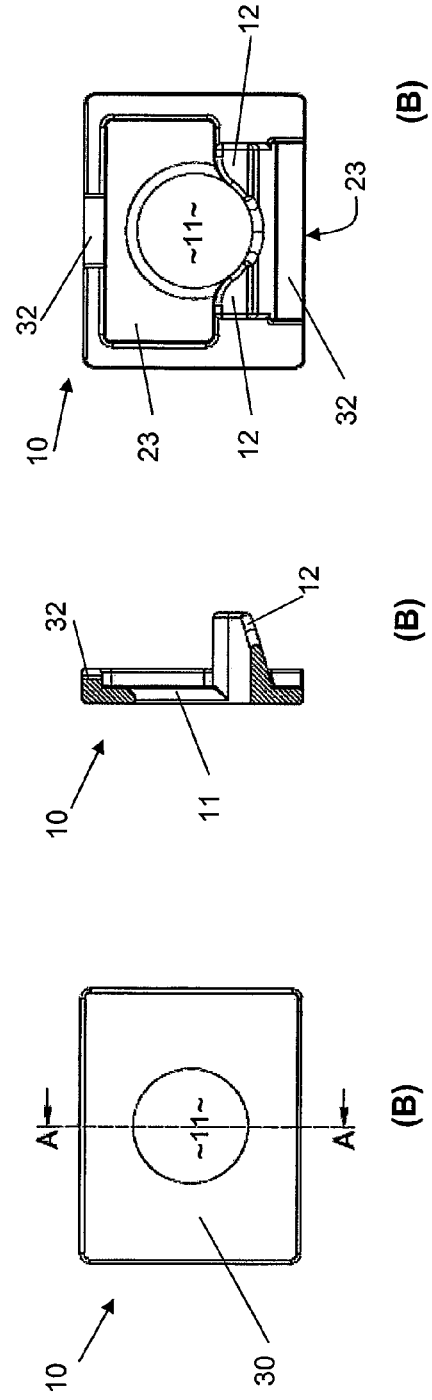
FIGURE 7
FIGURE 6
FIGURE 5

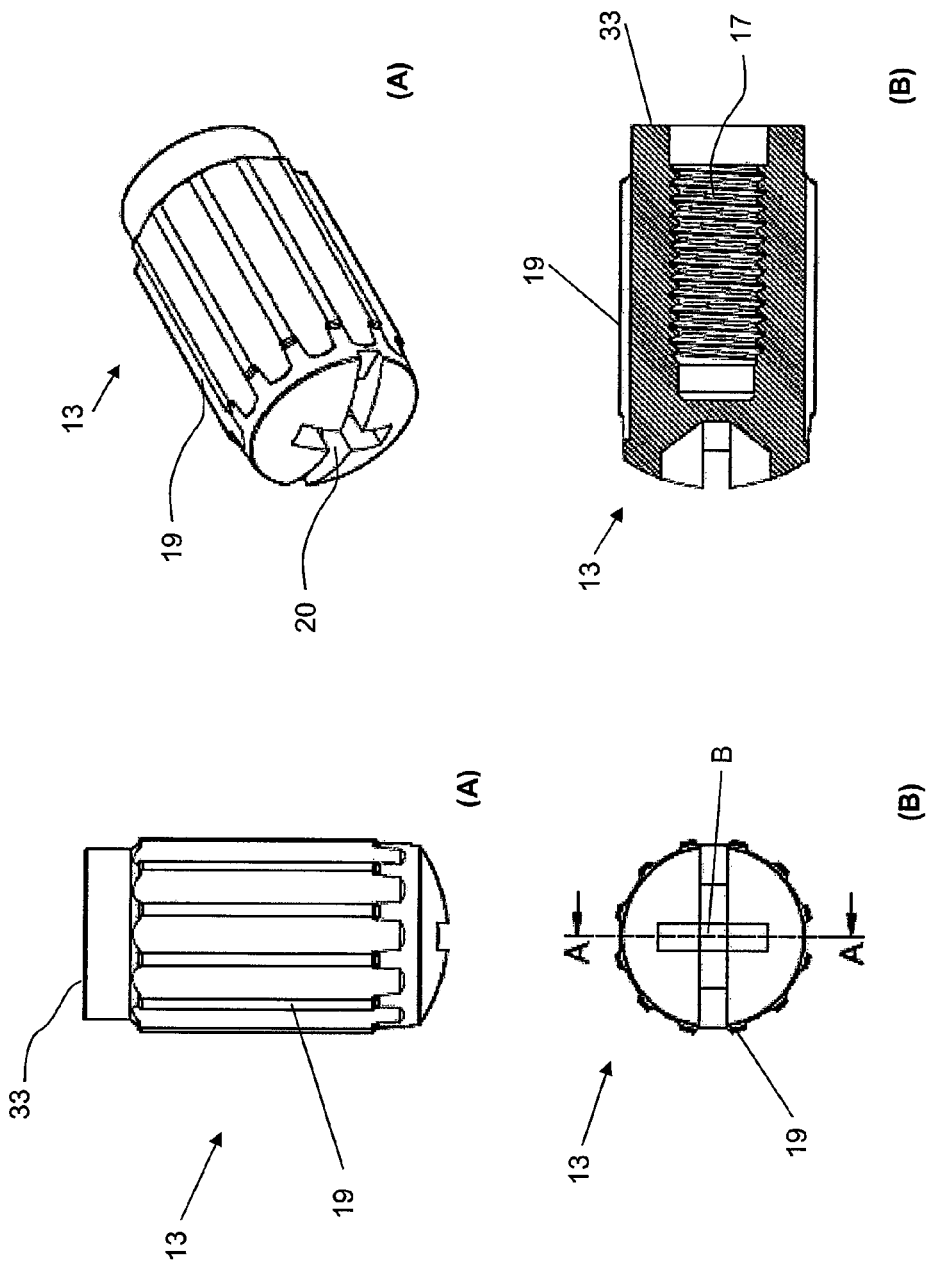

FASTENERS

TECHNICAL FIELD OF THE INVENTION

The present invention relates to fasteners.

In particular, though not solely, the present invention is directed to a blind fastener that may be inserted from one side of two members requiring fastening or securing to each other, for example electronic equipment to a rack (such as used in the telecommunications, information technology ("IT") security or professional audio industries), where access from another side of the two members is not available or at least is inconvenient.

BACKGROUND OF THE INVENTION

There is often the requirement to mount or attach equipment to a structure, such as for example electrical equipment in a rack. The racks normally are formed from 2 or 4 vertical elongate structures to form a cabinet type arrangement. Such racks are or can be closed on 3 or more sides, and the front side can have a door. As such, while it is possible to access any side by removing panels or similar it is often inconvenient, at least a time perspective. As such front access for install and removal of equipment and its fastening is the most desirable and convenient. The back side is normally reserved for electrical and network connections and similar.

The two structures that form the front of the rack normally have a series of spaced apertures on the front presenting vertical face. These apertures are to secure, via fasteners, the equipment to the rack. The access to these apertures is normally only from this front, as access from the rear is either blocked by the or other equipment, or is too difficult. Side access is often blocked by side panels that enclose the rack, or is otherwise inconvenient.

Then adding or removing equipment to the rack it is desirable this can be achieve as quickly as possible. This may be desirable because systems need to be powered down before equipment is added or removed, or because there is a short time frame to add or remove the equipment. It is also desirable to make the mechanical physical fastenings, convenient and as secure but as quick as possible.

There is therefore the need for a fastener for use where it is convenient or only possible, to access one side, that is the front side for example, of equipment that needs fastening to such structures or racks. This is opposed to a normal fastener arrangement where, for example, a user passes a bolt through one side and fastens a nut to it on the other.

The modularity of such racks and the equipment connected thereto has resulted in a number of solutions to this problem for rack mounting in the telecommunications, IT, security and professional audio industries.

A captive fastener solution is shown in U.S. Pat. No. 6,682,282 and US20050019133. This shows a captive bolt of one thread size which can be switched for a bolt of another thread size by releasing the bolt from a removable retainer. They are used for fastening rack mount panels to equipment racks. These solutions at least have the disadvantage that they must be supplied already attached to the equipment to be installed. Thus whilst they are always attached to the equipment, there will be surplus such fasteners, for example sitting on equipment that is not installed. They also require custom mounts and therefore are not readily adaptable or transferable between pieces of equipment.

Other solutions to aid the accessibility issue are blind nuts to sit behind the front face of the structure such as that shown in U.S. Pat. No. 6,538,894 for a front insertion fastener. This shows a front inserted nut that deforms to capture the structure between a front flange and rear wings that deform laterally to the main axis of the nut. The front flange has a return to engage with the structure edge to reduce rotation while tightening. The rear portion of the nut has a flange that engages with the rear side of the structure also due in part to deformation. Such solutions remove or reduce the need to access the rear of the structure. However, because they deform plastically and therefore permanently they present difficulty in removing in the same way they are inserted and may not be reusable. Such blind or captive nuts also have the disadvantage as they can easily be lost down or within the rack. These also often require specialist tools to install and remove.

A latch style fastener is shown in GB 1123733 where a knurled knob operates a latch tongue to engage and disengage the equipment from the structure. This is an easy way to engage and disengage the equipment from the rack. However, it again requires specialist fitting on the equipment and/or the rack.

Side mounting and engaging equipment is shown in U.S. Pat. No. 6,353,542. This shows a rack mounting bracket for mounting heavy unbalanced equipment. This rack mounting system is for either side of a piece of equipment that clamps the racks. This system holds the equipment securely but requires additional brackets, has added clearance and bulk issues and may require access from the side.

A number of these solutions also have sharp edges so they can easily damage equipment that is slide in and out past them, especially when the equipment is heavy and/or the rack is high populated with little room to move.

These solutions also require a degree of balancing equipment while other fasteners are brought into location to mount the equipment. This is undesirable when the equipment is heavy or the rack is populated and can result in equipment damage and/or operator injury.

In this specification where reference has been made to patent specifications, other external documents, or other sources of information, this is generally for the purpose of providing a context for discussing the features of the invention. Unless specifically stated otherwise, reference to such external documents is not to be construed as an admission that such documents, or such sources of information, in any jurisdiction, are prior art, or form part of the common general knowledge in the art.

It is an object of the present invention to provide an improved fastener, or to overcome the above shortcomings or address the above desiderata, or to at least provide the public with a useful choice.

BRIEF DESCRIPTION OF THE INVENTION

In a first aspect the present invention may be said to broadly consist in a blind fastener adapted to engage and hold a first member to a second member, comprising or including,
  a clip member adapted to install into a first aperture on said first member, said clip member having,
    a main body and a clipping tongue extending therefrom, said clipping tongue biased away from said body, so that when said clipping tongue and said main body are located in said first aperture said main body and said clipping tongue engage opposing regions of said first aperture, so that when engaged said clip member is substantially prevented from being withdrawn from said first aperture, and a mounting portion extending outwardly from said main body, a washer member with an aperture ("washer aperture") therethrough to pass over said mounting portion, said washer member having at least one extension to pass between said main body and said clipping tongue to urge them apart and against said opposing regions, a fastener to engage over said mounting portion to secure said clip member, washer member, and said second member, to said first member, wherein in use said clip member and washer member are mounted in said first aperture on said first member, said mounting portion extends through part of said second member, or an extension thereof, to be secured, and said fastener engages over said mounting portion to secure said second member to said first member.

Preferably said main body has at least one stop surface thereon to under-engage behind and/or in front of said aperture of said first member.

Preferably said main body has two said stop surfaces, at least one to under-engage in front of said aperture and at least one to under-engage behind said aperture.

Preferably said main body has a pair of said stop surfaces to under-engage in front of said aperture, either side of said main body.

Preferably said clipping tongue also has at least one stop surface to under-engage in front and/or behind said aperture.

Preferably said washer has two such extensions to locate substantially either side of an axis of said mounting portion.

Preferably said at least one extension is tapered so the more it is urged between said main body and clipping tongue the more it wedges the two apart.

Preferably said clip member, washer member and fastener are preferably made from a glass fibre reinforced plastic such as nylon or similar plastics material.

Preferably said mounting portion have a patterned engagement to engage said fastener thereon.

Preferably said patterned engagement is threaded, and said fastener is patterned to engage thereon.

Preferably an upper presenting region of said mounting portion is flattened to reduce damage to said any patterned engagement thereon.

Preferably said washer is a friction fit onto said mounting portion.

Preferably said friction fit is via said washer aperture.

Preferably said fastener has a surface texture to enable finger tightening and also has profiling to engage with a tool (for example a Philips or Blade screwdriver).

Preferably said clipping tongue is a re-curved extension of said main body with an elastic hinge between it and said main body to enable said biasing.

Preferably said clipping tongue must be elastically deformed to allow said stopping surface(s) to engage behind said aperture.

Preferably said washer has a relief between it and said clip member to allow prising apart of said two, for example by a screwdriver.

Preferably said washer is relieved on a side facing said clip member to accommodate portions thereof in front of said first member aperture.

Preferably said washer has a second relief on its external periphery to ease its removal from said mounting portion, by for example a finger nail or tool.

Preferably said blind fastener is able to be reused.

Preferably said clip member, as least where it traverses from in front to behind said aperture conforms to an inner periphery of said aperture.

Preferably said inner periphery is square or rectilinear in cross section.

Alternatively said inner periphery is curved, circular or arcuate.

Preferably said clip member is dimensioned so as to fit said aperture regardless of whether its inner periphery is rectilinear or curved.

Preferably said fastener is formed by plastic injection moulding.

Preferably said first member is a rack structure and said second member is equipment to be secured thereto.

Preferably said second member also has an aperture ("second member aperture") therethrough for said fastener to pass through.

Preferably said second member sits between said washer and said fastener.

In another aspect the present invention may be said to broadly consist in a blind fastener adapted to engage and hold a first member to a second member, comprising or including, a clip member adapted to install into an aperture on said first member, said clip member having, a main body and a clipping tongue extending therefrom, said clipping tongue biased away from said body, so that when said clipping tongue and said main body are located in said aperture said main body and said clipping tongue engage opposing regions of said aperture, so that when engaged said clip member is substantially prevented from being withdrawn from said aperture, and a mounting portion extending outwardly from said main body, a fastener to engage over said mounting portion to secure said clip member, and any second member present, to said first member, wherein in use said clip member is mounted in said aperture on said first member, said mounting portion extends through part of said second member, or an extension thereof, to be secured, and said fastener engages over said mounting portion to secure said second member to said first member.

Preferably there is a washer member with an aperture ("washer aperture") therethrough to pass over said mounting portion, said washer member having at least one extension to pass between said main body and said clipping tongue to urge them apart and against said opposing regions.

Preferably said washer member is installed on said mounting portion prior to mounting said second member and said fastener.

In another aspect the present invention may be said to broadly consist in a method of securing a first member to a second member, where said first member has at least one aperture, comprising or including the steps of, Locating a clip member into said aperture, said clip member having, a main body and a clipping tongue extending therefrom, said clipping tongue biased away from said body, so that when said clipping tongue and said main body are located in said aperture said main body and said clipping tongue engage opposing regions of said aperture, so that when engaged said clip member is substantially prevented from being withdrawn from said aperture, and a mounting portion extending outwardly from said main body, Locating said second member onto said mounting portion, Locating a fastener to engage over said mounting portion to secure said clip member and said second member, to said first member, Where in the result is an assembly of second member held to said first member by said clip member and said fastener.

Preferably said method includes the step of locating a washer member with an aperture therethrough to pass over said mounting portion, said washer member having at least one extension to pass between said main body and said clipping tongue to urge them apart and against said opposing regions, prior to mounting said second member and said fastener.

In yet another aspect the present invention may be said to broadly consist in a rack structure with at least one piece of equipment secured thereto, said equipment secured by a blind fastener, comprising or including, a clip member adapted to install into an aperture on said rack structure, said clip member having, a main body and a clipping tongue extending therefrom, said clipping tongue biased away from said body, so that when said clipping tongue and said main body are located in said aperture said main body and said clipping tongue engage opposing regions of said aperture, so that when engaged said clip member is substantially prevented from being withdrawn from said aperture, and a mounting portion extending outwardly from said main body, a washer member with an aperture therethrough to pass over said mounting portion, said washer member having at least one extension to pass between said main body and said clipping tongue to urge them apart and against said opposing regions, a fastener to engage over said mounting portion to secure said clip member, washer member, and said at least one piece of equipment, to said rack structure, wherein in use said clip member and washer member are mounted in said first aperture on said rack structure, said mounting portion extends through part of said at least one piece of equipment, or an extension thereof, to be secured, and said fastener engages over said mounting portion to secure said at least one piece of equipment to said rack structure.

In yet a further aspect still the present invention may be said to broadly consist in a kit of parts to hold a piece of equipment to a rack structure, comprising or including, Said equipment, and At least one blind fastener adapted to engage and hold said equipment to a rack, comprising or including, a clip member adapted to install into an aperture on said rack, said clip member having, a main body and a clipping tongue extending therefrom, said clipping tongue biased away from said body, so that when said clipping tongue and said main body are located in said aperture said main body and said clipping tongue engage opposing regions of said aperture, so that when engaged said clip member is substantially prevented from being withdrawn from said aperture, and a mounting portion extending outwardly from said main body, a fastener to engage over said mounting portion to secure said clip member, and said equipment, to said rack, wherein in use said clip member is mounted in said aperture on said rack, said mounting portion extends through part of said equipment, or an extension thereof, to be secured, and said fastener engages over said mounting portion to secure said equipment to said rack.

Preferably there is a washer member with an aperture ("washer aperture") therethrough to pass over said mounting portion, said washer member having at least one extension to pass between said main body and said clipping tongue to urge them apart and against said opposing regions.

In yet a further aspect the present invention may be said to consist in a blind fastener as herein described with reference to any one or more of the accompanying drawings.

In yet a further aspect the present invention may be said to consist in a method of securing as herein described with reference to any one or more of the accompanying drawings.

In yet a further aspect the present invention may be said to consist in a rack structure with at least one piece of equipment secured thereto as herein described with reference to any one or more of the accompanying drawings.

In yet a further aspect the present invention may be said to consist in a kit of parts as herein described with reference to any one or more of the accompanying drawings.

As used herein the term "and/or" means "and" or "or", or both.

As used herein "(s)" following a noun means the plural and/or singular forms of the noun.

The term "comprising" as used in this specification means "consisting at least in part of". When interpreting statements in this specification which include that term, the features, prefaced by that term in each statement, all need to be present, but other features can also be present. Related terms such as "comprise" and "comprised" are to be interpreted in the same manner.

It is intended that reference to a range of numbers disclosed herein (for example, 1 to 10) also incorporates reference to all rational numbers within that range (for example, 1, 1.1, 2, 3, 3.9, 4, 5, 6, 6.5, 7, 8, 9 and 10) and also any range of rational numbers within that range (for example, 2 to 8, 1.5 to 5.5 and 3.1 to 4.7).

The entire disclosures of all applications, patents and publications, cited above and below, if any, are hereby incorporated by reference.

This invention may also be said broadly to consist in the parts, elements and features referred to or indicated in the specification of the application, individually or collectively, and any or all combinations of any two or more of said parts, elements and features, and where specific integers are mentioned herein which have known equivalents in the art to which this invention relates, such known equivalents are deemed to be incorporated herein as if individually set forth.

Other aspects of the invention may become apparent from the following description which is given by way of example only and with reference to the accompanying drawings.

BRIEF DESCRIPTION OF THE DRAWINGS

Preferred forms of the present invention will now be described with reference to the accompanying drawings in which;

FIG. 1 shows an isometric of the clip member of the present invention,

FIG. 2 shows an end view of the clip member of FIG. 1,

FIG. 3 shows a plan view of the clip member,

FIG. 4 shows a right hand view of the clip member,

FIG. 5a shows a plan view of the washer,

FIG. 5b shows a front view of the washer,

FIG. 6a shows an isometric view with hidden detail of the washer,

FIG. 6b shows a cross-sectional view on line AA of FIG. 5b,

FIG. 7a shows a rear isometric view of the washer,

FIG. 7b shows a rear view of the washer,

FIG. 8a shows a plan view of the fastener,

FIG. 8b shows an end view of the fastener,

FIG. 9a shows a top isometric view of the fastener,

FIG. 9b shows a cross-sectional view along line AA of FIG. 8b of the fastener,

DETAILED DESCRIPTION OF THE INVENTION

Figure 10:
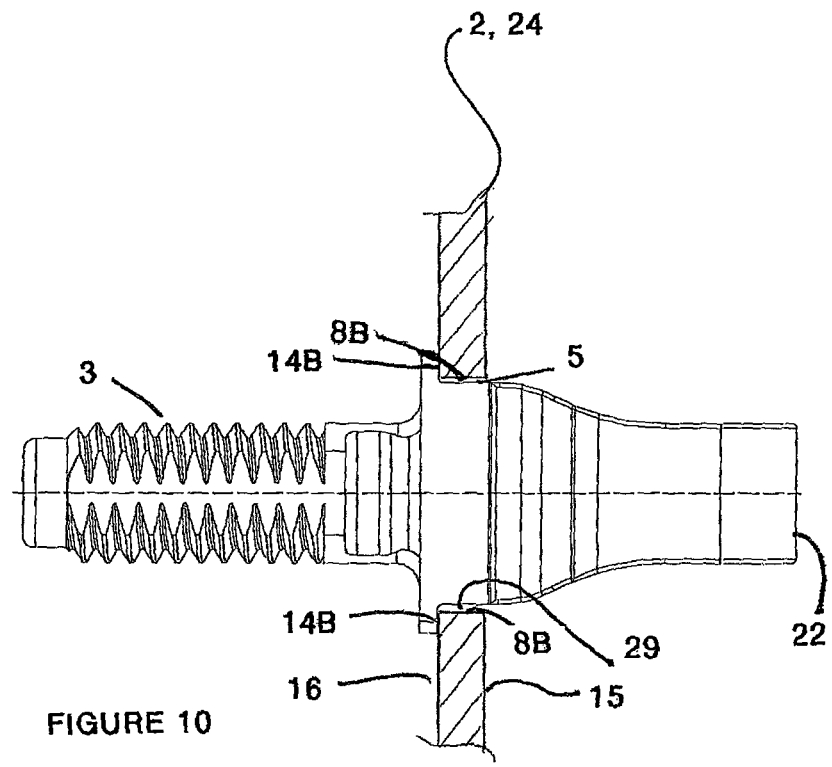
FIG. 10 shows the locations of the first member showing in plan view the location of the first member rack (structure) and second member (equipment) on the clip member.

Preferred embodiments will now be described with reference to FIGS. 1 through 14.

With reference to FIGS. 1 through 4 there is shown a clip member 3 which is part of the assembly of line fastener 1. The clip member has a main body 6 and depending from the main body is a clipping tongue 7. The clipping tongue exists as a recurved extension 21 from the main body 6 and forms an elastic hinge 22 at or near the point of recurving. Depending outwardly from the main body 6 is a mounting portion 9 which is patterned 17 for engagement with a complimentary patterned fastener 13 (shown in FIGS. 8a, b and 9a, b). However in other less preferred embodiments it may be a clip or other type fit that may be used.

The upper presenting surface 18 of the mounting portion 9 in the preferred embodiment is flattened. There are several reasons for this. The first reason is to prevent damage to the patterned 17 engagement. A further reason is to allow a stable location for temporarily seating equipment or second member 4 (not shown) on the mounting portion 9.

On the main body also is shown a number of stop surfaces 14. The purpose of these is to locate behind 15 the aperture 5 when engaged in the first into rack 24. This can best be seen in FIGS. 10 through 12. In particular stop surface 14a locates on the surface behind 15 the aperture 5. The stop surface 14b located at front 16 of the aperture 5 in the first member 2 or rack 24. A person skilled in the art will understand in conjunction particularly with FIGS. 10 through 12, this creates an initial engagement of the clip member 3 with the surfaces in front 16 and behind 15 of the aperture 5 to substantially prevent withdrawal of the clip member 3 from the aperture 5 without further bending or hinging of the clipping tongue 7. Present also are at least one and preferably two engagement surfaces 28 that when engaged in the aperture 5 bear on opposing regions 8 of the aperture 5. This can best be seen in FIG. 12. The result is that when the clip member 3 is located in the aperture 5, the clip member 3 is substantially held in the aperture 5, clip member 3 also and is stable and will not fall out. It is to be appreciated that the elastic hinge 22 can account for a number of different sizes and tolerances for apertures 5 and in the preferable installation is bent upwards so as to bias downward or outward with reference to FIG. 4 to therefore have the engagement surfaces 28 located and urged or bias against each of its respective opposing region 8.

In the preferred embodiment of the clip member 3, there is also present a scallop 27 opening toward the upwardly presenting as shown in FIGS. 1 and 4. This scallop provides a location for the second member 4 or equipment 25. This provides the initial effect of preventing the second member 4 or equipment 25 from moving outward due to its sitting or its engagement within the scallop and thus provides some temporary security initially and also provides long term security once the fastener 13 is tightened thereon.

Present also are side surfaces 29 as shown in FIGS. 1 and 3. These have the purpose of bearing against the inner surfaces of the aperture 5 to which the clip member 3 is engaged. The person skilled in the art will understand that these surfaces together with the engagement surfaces 28 are dimensioned so as to fit the mean internal dimensions of the aperture 5. These surfaces add stability to the blind fastener 1 in its initial installation and also once tightened up using the fastener 13. The distance between stop surface 14a and stop surface 14b is dimensioned also to be substantially the same with minimal clearance as the through thickness of the first member 2 or rack 24 in which the aperture 5 is engaged. This dimensioning will provide minimal movement of the clip member 3 prior to tightening up with the fastener 13.

Seen in FIGS. 1 and 4 also it can be seen the generally tapering outwardly shape from the elastic hinge 22 end of the clip member 3 toward the main body 6. The elastic hinge 22 is the end which is inserted first into the aperture 5 and the generally tapering or expanding shape provides ease of insertion whilst also automatically loading up the clipping tongue 7 and guiding it into place on its respective opposing region 8. In the main for such insertion curved surfaces rather than sharp surfaces are present, except where there is a requirement to reduce any movement, so as to aid ease of insertion.

Figure 11:
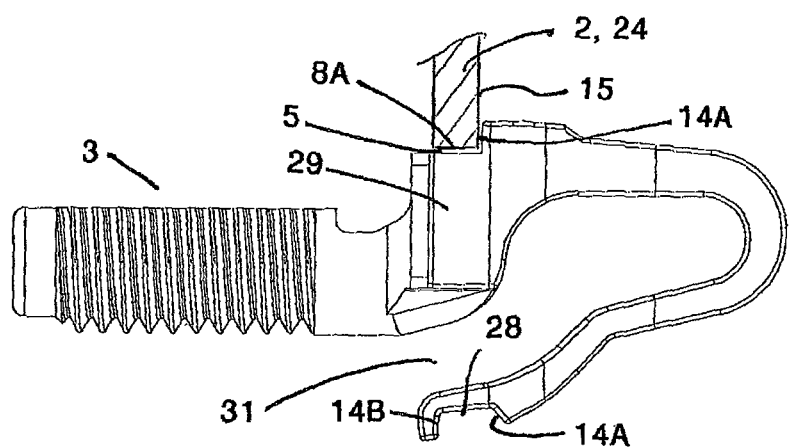
FIG. 11 shows a similar view to that of FIG. 10 in side view.
Figure 12:
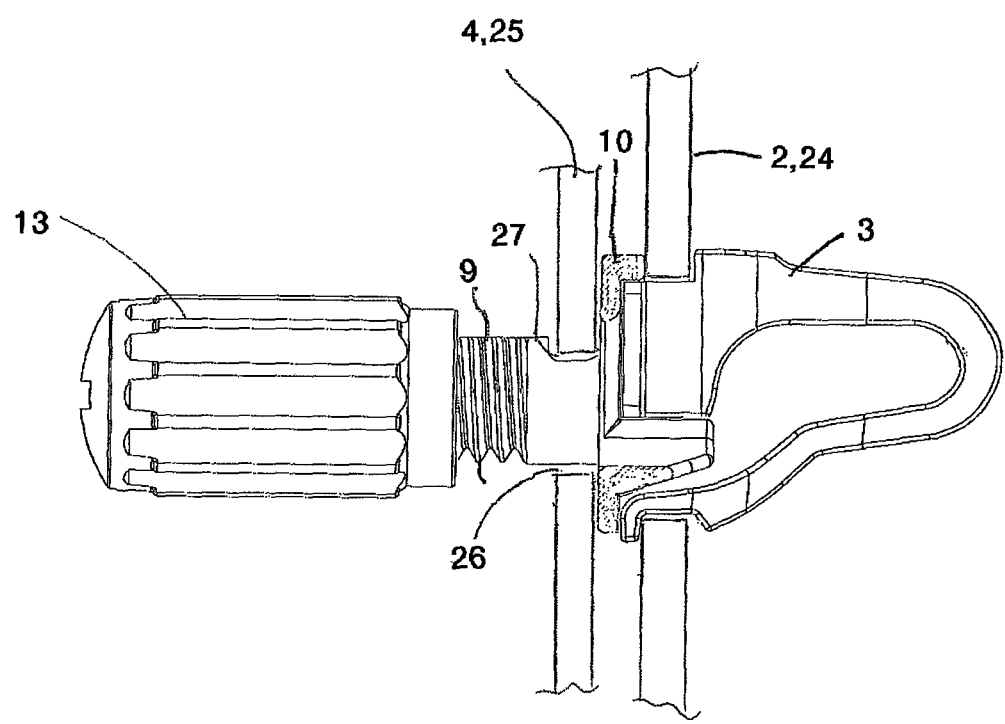
FIG. 12 shows a sectional detailed view of the blind fastener installed into an aperture in a rack together with the washer and fastener installed to tighten the second member (equipment) to the first member (rack structure)
Figure 13:
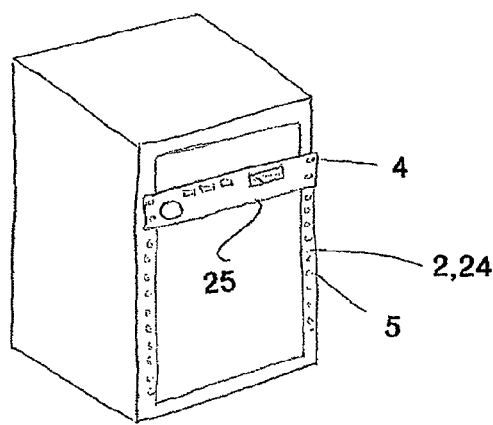
FIG. 13 shows an isometric schematic view of equipment installed in a rack using the fastener on the present invention.
Figure 14:
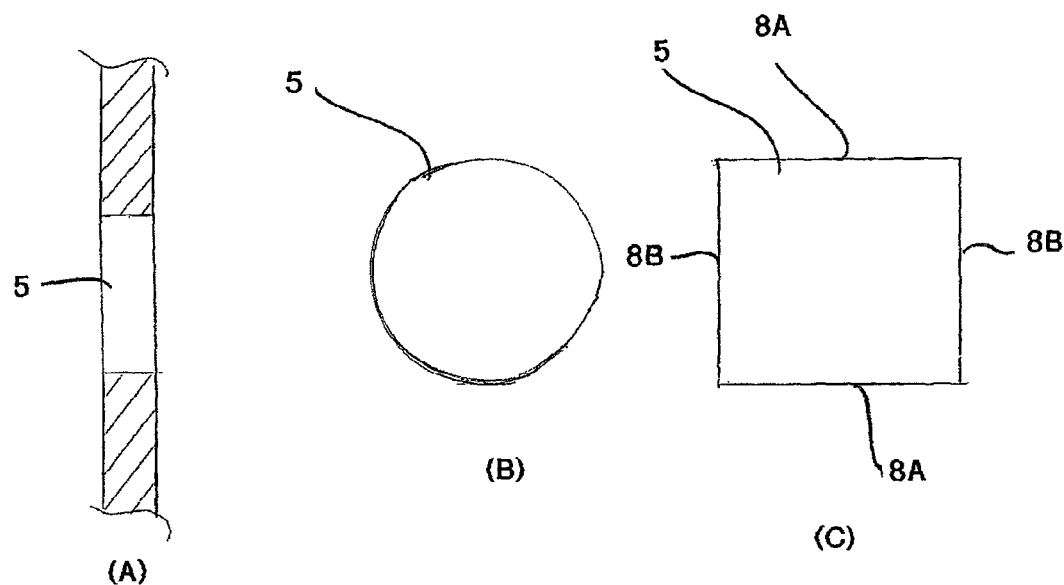
FIG. 14a shows a cross section through the first member or rack, showing the aperture therethrough.
FIG. 14b shows the profile of the aperture, being circular.
FIG. 14c shows an aperture through the rack of a square cross-section.

A washer member 10 is shown in FIGS. 5a through 7b and acts as a planar bearing surface as well as a wedging component to lock the clip member 3 into the aperture 5. The washer member 10 presents a substantially planar face 30 which can bear on the back side of the second member 4 or equipment 25. Present through the middle region of the washing member 10 is a washer aperture 11. This is dimensioned so as to provide a slight or actual interference fit with the cross section dimensions of the mounting portion 9. It may for example have feathered fingers or similar and engage with the patterning 17. This is done so as to temporarily lock the washer member 10 in place when located on the mounting portion 9 of the clip member 3. Extending from the back side surface of the washing member 10 is at least one extension 12. The washer and its extensions 12 seeks to oppose the forces on the clip member that try to extract it from the aperture 5. In the preferred embodiment there are two such extensions 12 as shown in FIGS. 7a and b. These are profiled so as to fit in the gap 31 of the clipping tongue 7 and main body 6 as shown in FIGS. 4 and 11. Particularly, these extensions are tapered so as to act as wedging members when the clipping tongue 7 is elastically deformed when located in the aperture 5. The purpose of the extensions 12 will be understood when FIG. 12 is viewed. These act as a wedge or cam and bear on the lower portions of the main body 6 and the upper portions of the clipping tongue 7 to urge the two apart and therefore locate the engaging surfaces against their surfaces of the aperture 5. Furthermore the extensions lock and prevent substantial movement of the clipping tongue 7 relative to the main body 6 so at least when the blind fastener 1 is assembled with the fastener 13 in place, the blind fastener 1 cannot be extracted from the aperture 5 without substantial deformation beyond the normal scope of its use. This extends beyond the normal scope of its use and design load characteristics.

The back side surface of the washing member 10 also has relief 23 so as to provide as close a fit against the front presenting surfaces of the clip member 3. This can be seen in the cross section in FIG. 12. Seen also in FIGS. 6a and b and 7a and b is a second relief 32 (top and bottom) that allows for a tool or a user's fingernail to prise the washing member 10 away from the clip member 3 when installed thereon. This may be required when the two members have been engaged under force or a long period of time or under other circumstances such as the two stick or are wedged to each other. This may also be due to some partial deformation of the two, whether permanent or temporary. There may also be an interference fit between the relief 23 and those surfaces which engages with on the clip member 3 to further hold the washing member 10 to the clip member 3. Therefore the second relief 32 may also be required.

A further second relief 32 is also shown on the lower surfaces of the washer member 10 in FIGS. 7a and 7b.

A preferred form of the fastener 13 is shown in FIGS. 8a through 9b. In the form shown, the fastener 13 has an internal pattern 17 that in this case is threaded to match the threading size of the mount portion 9. The fastener 13 has surface texturing 19, such as knurling present to increase the friction or contact between a user's fingers and the fastener 13 so as to allow finger tightening to as higher a degree as possible or as desired. Other surface texturing 19 different to that shown can be used and will be understood to be equivalent. Shown also is a tool profiling in FIGS. 9a and 8b. The purpose of this to receive a tool such as a Phillips head screwdriver or a blade screwdriver to tighten or release the fastener 13 as is needed. The fastener 13 has a bearing surface 33 present as shown in FIGS. 8a and 9b which bears up or butts up against the outer presenting surface of the second member 4 or equipment 25 as would be understood when viewed with FIG. 12.

Seen in FIG. 9b there is also internal profiling in addition to the patterning 17 which allows further bearing and or stopping against the mounting portion 9.

With reference to FIGS. 10 through 12 the assembly of the blind fastener and its use will now be described. The first member 2 or rack 24 can be seen in through section in FIGS. 10 and 11. The aperture 5 through the first member 2 or rack 24 is shown in FIG. 14a and the square or rectangular profile is shown in FIG. 14c. An alternative profile shown in FIG. 14b is circular. It will be understood the same principals of the invention can be applied to a clip member 3 whose stop surfaces 14, engagement surfaces 28 and side surfaces 29 are contoured and profiled so as to fit such a circular arcuate or curved aperture 5. The first member 2 has a surface behind 15 and a surface in front 16. It will be seen in FIG. 10, the stop surfaces 14b engage on the surface in front 16 and the stop surfaces 14a engage on the surfaces behind 15 as shown in FIG. 11. Also shown here is the dimensioning between the stop surfaces 14a and 14b so as to be substantially the same as the through thickness from in front 16 to behind 15 of the aperture 5 in the first member 2 (or rack 24). The method of installation is such that the elastic hinge 22 end of the clip member 3 is located first into the aperture 5 and thereafter the clip member 3 is pushed through deforming the lower portion of the clipping tongue 7 until the stop surfaces 14a and 14b engage on their respective sides of the aperture 5 and first member 2 and likewise the side surfaces 29 and engaging surfaces 28 engage on their respective opposed regions. The opposed regions for a square or rectangular aperture 5 are shown in FIG. 14c as opposing regions 8a for the engagement surfaces 28 and 8b for the side surfaces 29. In a similar way, a curved or a circular aperture 5 shown in FIG. 14b will have a similar such surfaces.

With reference to FIG. 12, there is shown the first member 2 (or rack 24) engaged as shown in FIGS. 10 and 11 on the clip member 3 and thereafter the washer member 10 is slid into position over the mounting portion 9 thereafter the second member 4 (or equipment 25) is slid over the mounting portion 9 so that the mounting portion engages in the second member aperture 26 (whether fully opened or closed aperture) but under action of gravity or by the user, the second member 4 or equipment 25 sits down to engage the scallop 27. Thereafter the fastener 13 is engaged on the mounting portion 9 and thereafter sandwiches the second member 4, washer 10 and clip member 3 to assemble and hold the equipment 25 to the rack 24.

Shown in the equipment rack and specifically shown is the first member 2, which may also be the normally vertically presenting legs of the rack 24 and shown located in place is a piece of equipment 25 and specifically the second member 4. Seen also are a plurality of apertures 5 for mounting of equipment at various heights in the rack. The present invention may be supplied as a kit of parts including the equipment 25 (or second member 4) and the blind fastener consisting at least of the clip member 6 and fastener 13. Additionally there may also be supplied the washing member 10.

Alternatively it may be the rack 24 (or first member 2) that is supplied in the kit of parts with at least one blind fastener consisting of a clip member 3 and fastener 13 and preferably also the washing member 10.

The foregoing description of the invention includes preferred forms thereof. Modifications may be made thereto without departing from the scope of the invention.

The invention claimed is:

1. A blind fastener adapted to engage and hold a first member to a second member, said blind fastener comprising or including,
   a clip member adapted to install into a first aperture on said first member, said clip member having,
      a main body and a clipping tongue extending therefrom, said clipping tongue biased away from said body, so that when said clipping tongue and said main body are located in said first aperture said main body and said clipping tongue engage opposing regions of said first aperture, so that when engaged said clip member is substantially prevented from being withdrawn from said first aperture, and
      a mounting portion extending outwardly from said main body,
   a washer member with an aperture ("washer aperture") therethrough to pass over said mounting portion, said washer member having at least one extension to pass between said main body and said clipping tongue to urge them apart and against said opposing regions,
   a fastener to engage over said mounting portion to secure said clip member, washer member, and said second member, to said first member, wherein in use said clip member and washer member are mounted in said first aperture on said first member, said mounting portion extends through part of said second member, or an extension thereof, to be secured, and said fastener engages over said mounting portion to secure said second member to said first member.

2. The blind fastener as claimed in claim 1 wherein said main body has at least one stop surface thereon to under-engage surfaces behind and/or in front of said first aperture.

3. The blind fastener as claimed in claim 2 wherein said main body has a pair of said stop surfaces to under-engage in front of said first aperture, either side of said main body.

4. The blind fastener as claimed in claim 2 wherein said main body has at least one said stop surfaces to under-engage behind said first aperture.

5. The blind fastener as claimed in claim 2 wherein said clipping tongue also has at least one stop surface to under-engage in front and/or behind said first aperture.

6. The blind fastener as claimed in claim 1 wherein said washer has two such extensions to locate substantially either side of a longitudinal axis of said clip member.

7. The blind fastener as claimed in claim 1 wherein said at least one extension is tapered so the more it is urged between said main body and clipping tongue the more it wedges the main body and the clipping tongue apart.

8. The blind fastener as claimed in claim 1 wherein said clip member, washer member and fastener are made from a fiber glass reinforced plastic such as nylon or similar plastics material.

9. The blind fastener as claimed in claim 1 wherein said mounting portion has a patterned engagement to engage said fastener thereon.

10. The blind fastener as claimed in claim 9 wherein said patterned engagement is threaded, and said fastener is patterned to engage thereon.

11. The blind fastener as claimed in claim 9 wherein an upper presenting region of said mounting portion is flattened.

12. The blind fastener as claimed in claim 1 wherein said washer is a friction fit onto said mounting portion.

13. The blind fastener as claimed in claim 12 wherein said friction fit is via said washer aperture.

14. The blind fastener as claimed in claim 1 wherein said fastener has a surface texture to enable finger tightening.

15. The blind fastener as claimed in claim 1 wherein said fastener has profiling to engage with a tool.

16. The blind fastener as claimed in claim 1 wherein said clipping tongue is a re-curved extension of said main body with an elastic hinge between it and said main body to enable bias.

17. The blind fastener as claimed in claim 1 wherein said main body has at least one stop surface to under-engage surfaces behind and/or in front of said first aperture and wherein said clipping tongue must be elastically deformed to allow said stop surface(s) to engage behind said first aperture.

18. The blind fastener as claimed in claim 1 wherein said washer member has a relief between it and said clip member to allow prying apart of said washer member and said clip member.

19. The blind fastener as claimed in claim 1 wherein said washer is relieved on a side facing said clip member to accommodate portions thereof in front of said first aperture.

20. The blind fastener as claimed in claim 1 wherein said washer has a second relief on its external periphery to ease its removal from said mounting portion.

21. The blind fastener as claimed in claim 1 wherein said blind fastener is able to be reused.

22. The blind fastener as claimed in claim 1 wherein said clip member has an outer periphery that, conforms to an inner periphery of said first aperture at least where it transverses from in front to behind said first aperture.

23. The blind fastener as claimed in claim 22 wherein said outer periphery is square or rectilinear in cross section.

24. The blind fastener as claimed in claim 22 wherein said outer periphery is curved, circular or arcuate.

25. The blind fastener as claimed in claim 22 wherein said clip member is dimensioned so as to fit said first aperture regardless of whether its inner periphery is rectilinear or curved.

26. The blind fastener as claimed in claim 1 wherein said fastener is formed by plastic injection moulding.

27. The blind fastener as claimed in claim 1 wherein said first member is a rack structure and said second member is equipment to be secured thereto.

28. The blind fastener as claimed in claim 1 wherein said second member also has an aperture ("second aperture") therethrough for said fastener to pass through.

29. The blind fastener as claimed in claim 1 wherein said second member sits between said washer and said fastener.

30. A blind fastener adapted to engage and hold a first member to a second member, comprising or including,
- a clip member adapted to install into a first aperture on said first member, said clip member having,
  - a main body and a clipping tongue extending therefrom, said clipping tongue biased away from said body, so that when said clipping tongue and said main body are located in said first aperture said main body and said clipping tongue engage opposing regions of said first aperture, so that when engaged said clip member is substantially prevented from being withdrawn from said first aperture, and
  - a mounting portion extending outwardly from said main body,
- a fastener to engage over said mounting portion to secure said clip member, and any second member present, to said first member,
- a washer member with a washer aperture therethrough to pass over said mounting portion, said washer member having at least one extension to pass between said main body and said clipping tongue to urge them apart and against said opposing regions,
- wherein in use said clip member is mounted in said aperture on said first member, said mounting portion extends through part of said second member, or an extension thereof, to be secured, and said fastener engages over said mountain portion to secure said second member to said first member.

31. The blind fastener as claimed in claim 30 wherein said washer member is installed on said mounting portion prior to mounting said second member and said fastener.

32. A method of securing a first member to a second member, where said first member has at least one aperture, comprising the steps of,
- locating a clip member into said aperture, said clip member having,
  - a main body and a clipping tongue extending therefrom, said clipping tongue biased away from said body, so that when said clipping tongue and said main body are located in said aperture said main body and said clipping tongue engage opposing regions of said aperture, so that when engaged said clip member is substantially prevented from being withdrawn from said aperture, and a mounting portion extending outwardly from said main body, locating said second member onto said mounting portion, locating a fastener to engage over said mounting portion to secure said clip member and said second member, to said first member, locating a washer member with a washer aperture therethrough to pass over said mounting portion, said washer member having at least one extension to pass between said main body and said clipping tongue to urge them apart and against said opposing regions, prior to mounting said second member and said fastener, wherein a result is an assembly of second member held to said first member by said clip member and said fastener.

33. A rack structure with at least one piece of equipment secured thereto, said equipment secured by a blind fastener, comprising or including, a clip member adapted to install into a first aperture on said rack structure, said clip member having, a main body and a clipping tongue extending therefrom, said clipping tongue biased away from said body, so that when said clipping tongue and said main body are located in said aperture said main body and said clipping tongue engage opposing regions of said first aperture, so that when engaged said clip member is substantially prevented from being withdrawn from said first aperture, and a mounting portion extending outwardly from said main body, a washer member with a washer aperture therethrough to pass over said mounting portion, said washer member having at least one extension to pass between said main body and said clipping tongue to urge them apart and against said opposing regions, a fastener to engage over said mounting portion to secure said clip member, washer member, and said at least one piece of equipment, to said rack structure, wherein in use said clip member and washer member are mounted in said aperture on said rack structure, said mounting portion extends through part of said at least one piece of equipment, or an extension thereof, to be secured, and said fastener holds a resulting assembly to secure said at least one piece of equipment, to said rack structure.

34. A kit of parts to hold a piece of equipment to a rack structure, comprising or including, said equipment, and at least one blind fastener adapted to engage and hold said equipment to a rack, comprising or including, a clip member adapted to install into an aperture on said rack, said clip member having, a main body and a clipping tongue extending therefrom, said clipping tongue biased away from said body, so that when said clipping tongue and said main body are located in said aperture said main body and said clipping tongue engage opposing regions of said aperture, so that when engaged said clip member is substantially prevented from being withdrawn from said aperture, and a mounting portion extending outwardly from said main body, a washer member with a washer aperture therethrough to pass over said mounting portion, said washer member having at least one extension to pass between said main body and said clipping tongue to urge them apart and against said opposing regions, a fastener to engage over said mounting portion to secure said clip member, and said equipment, to said rack, wherein in use said clip member is mounted in said aperture on said rack, said mounting portion extends through part of said equipment, or an extension thereof, to be secured, and said fastener engages over said mountain portion to secure said equipment to said rack.

* * * * *